United States Patent [19]

Choquette et al.

[11] Patent Number: 5,212,701
[45] Date of Patent: May 18, 1993

[54] SEMICONDUCTOR SURFACE EMITTING LASER HAVING ENHANCED OPTICAL CONFINEMENT

[75] Inventors: Kent D. Choquette, New Providence; Robert S. Freund, Livingston; Minghwei Hong, Berkeley Heights, all of N.J.

[73] Assignee: AT&T Bell Laboratories, Murray Hill, N.J.

[21] Appl. No.: 857,350

[22] Filed: Mar. 25, 1992

[51] Int. Cl.$^5$ .................................................. H015 3/19
[52] U.S. Cl. ........................................ 372/45; 372/46; 372/96
[58] Field of Search .................... 372/45, 46, 96, 99

[56] References Cited

U.S. PATENT DOCUMENTS 5,018,159  5/1991  Suzuki et al. .................... 372/46

FOREIGN PATENT DOCUMENTS 0021090  1/1991  Japan .................................. 372/46
0021091  1/1991  Japan .................................. 372/46

OTHER PUBLICATIONS

J. L. Jewell, et al. "Low-Threshold Electrically Pumped Vertical-Cavity Surface Emitting Microlasers", *Electron. Lett.* 25 pp. 1123-1124, (1989).

Y. H. Lee, et al. "Effects of Etch Depth and Ion Implantation on Surface Emitting Microlasers," *Electron. Lett.*, vol. 26, pp. 225-227, (1990).

H. Yoo, et al. "Fabrication of a Two-Dimensional Phased Array of Vertical-Cavity Surface-Emitting Lasers," *Appl. Phys. Lett.*, vol. 59, pp. 1198-1200, (1990).

R. S. Geels, et al. "Low Threshold Planarized Vertical-Cavity Surface Emitting Lasers," *IEEE Tech. Lett.*, vol. 2, pp. 234-236, (1990).

R. S. Geels, et al. "Submilliamp Threshold Vertical-Cavity Laser Diodes," *Appl. Phys. Lett.*, vol. 57, pp. 1605-1607, (1990).

Y. J. Yang, et al. "Low-Threshold Operation of a GaAs Single Quantum Well Mushroom Structure Surface-Emitting Laser," *Appl. Phys. Lett.*, vol. 58, pp. 1780, (1991).

M. Ogura, et al. "Surface-Emitting Laser Diode with Vertical GaAs/GaAlAs Quarter-Wavelength Multilayers and Lateral Buried Heterostructure", *Appl. Phys. Lett.* vol. 51, pp. 1655-1657, (1987).

A. Ibaraki, et al. "Buried Heterostructure GaAs/GaAlAs Distributed Bragg Reflector Surface Emitting Laser with Very Low Threshold (5.2 mA) under Room Temperature CW Conditions," *Jpn. J. Appl. Phys.* vol. 28, L. 667-L 668 (1989).

F. Koyama, et al. "Room Temperature Continuous Wave Lasing Characteristics a GaAs Vertical Cavity Surface-Emitting Laser," *Appl. Phys. Lett.* vol. 55, pp.221-222, (1989).

M. Ogura, et al. "Surface-Emitting Laser Diode with Distributed Bragg Reflector and Buried Heterostructure," *Electron. Lett.* vol. 26, pp. 18-19, (1990).

M. Shimada, et al. "Low-Threshold Surface-Emitting Laser Diodes with Distributed Bragg Reflectors and Current Blocking Layers," *Appl. Phys. Lett.* vol. 57, pp. 1289-1291, (1990).

(List continued on next page.)

Primary Examiner—Georgia Y. Epps
Attorney, Agent, or Firm—Glen E. Books

[57] ABSTRACT

The present applicants have discovered that one can make a surface emitting laser with enhanced optical confinement and improved heat sinking characteristics by etching away portions of the growth layers peripheral to the intended laser cavity and regrowing peripheral regions of material having a lower index of refraction than the active region. Using low damage etching and either in situ regrowth or hydrogen plasma cleaning followed by regrowth, a surface emitting laser having enhanced optical isolation and heat sinking characteristics can be made.

6 Claims, 3 Drawing Sheets

OTHER PUBLICATIONS

A. Ibaraki, et al. "GaAs Buried Heterostructure Vertical Cavity Top-Surface Emitting Lasers," *IEEE J. Quan. Electron.* vol. 27, p. 1386 (1991).

R. P. H. Chang, et al. "Hydrogen Plasma Etching of GaAs oxide," *Appl. Phys. Lett.* 38, pp. 898–900, (1981).

P. Friedel, et al. "Interactions Between $H_2$ and $N_2$ Plasmas and a GaAs(100) Surface: Chemical and Electronic Properties," *Appl. Phys. Lett.*, vol. 42, pp. 509–511, (1983).

K. Asakawa, et al. "Damage and Contamination-Free GaAs and AlGaAs Etching Using a Novel Ultrahigh-Vacuum Reactive Ion Beam Etching System with Etched Surface Monitoring and Cleaning Method," *J. Vac. Sci. Techno.*, A4, p. 677 (1986).

S. Sugata, et al. "GaAs Cleaning with a Hydrogen Radical Beam Gun in an Ultrahigh-Vacuum System," *J. Vac. Sci. Technol.* B6, pp. 1087–1091, (1988).

N. Kondo et al. "Low-Temperature Surface Cleaning of GaAs by Electron Cyclotron Resonance (ECR) Plasma," *Jpn. J. Appl. Phys.* vol. 28, L7 (1989).

S. V. Hattangady, et al. "In Situ Cleaning of GaAs Surfaces Using Hydrogen Dissociated With a Remote Noble-Gas Discharge," *J. Appl. Phys.* vol. 68, pp. 1233–1236, (1990).

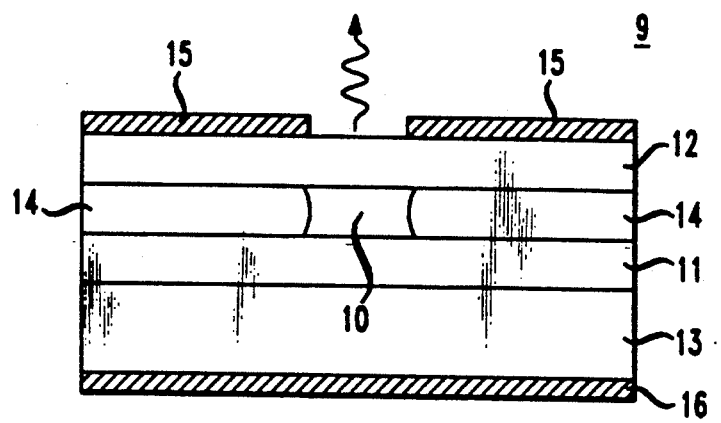
FIG. 1
(PRIOR ART)
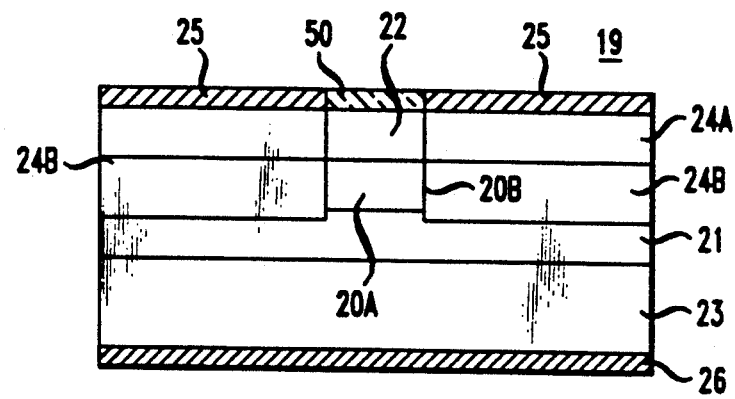
FIG. 2
FIG. 3
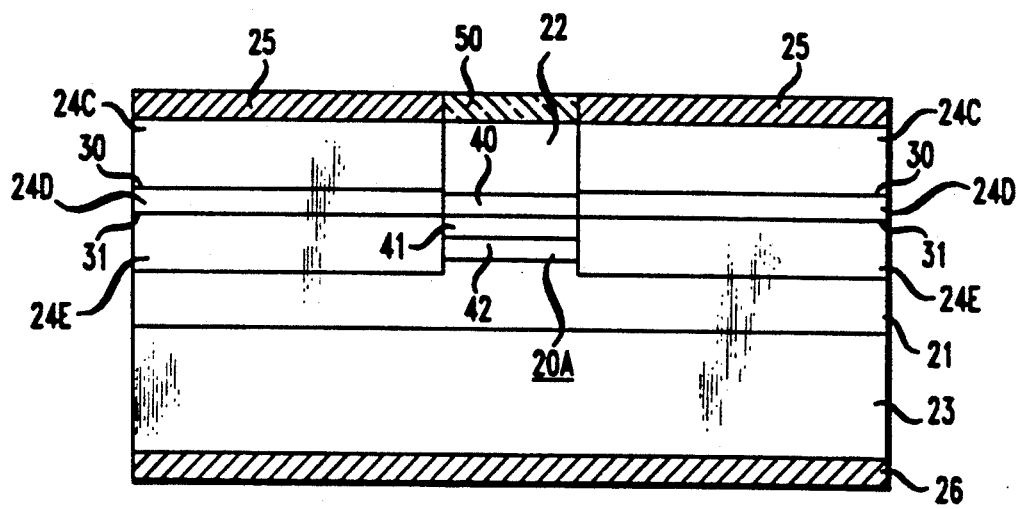

SEMICONDUCTOR SURFACE EMITTING LASER HAVING ENHANCED OPTICAL CONFINEMENT

FIELD OF THE INVENTION

This invention relates to semiconductor lasers and, in particular, to a semiconductor vertical cavity laser having enhanced optical confinement. Methods for making such a structure are also described.

BACKGROUND OF THE INVENTION

Semiconductor lasers are attractive for a wide variety of applications including telecommunications, computing systems, optical recording systems and optical interconnection of integrated circuits. Semiconductor lasers provide a compact source of coherent, monochromatic light which can be modulated at high bit rates to transmit large amounts of information.

Vertical cavity surface emitting lasers (VCSELs) are particularly promising for applications requiring two dimensional arrays of lasers. As contrasted with edge emitting lasers which emit light parallel to the growth planes of their substrates, VCSELs emit light perpendicular to the substrates. A typical VCSEL comprises an active region sandwiched between a pair of distributed Bragg reflector stacks. Upon injection of suitable current through the active region, laser light is emitted transverse to the planes of growth.

One difficulty with conventional VCSELs is the problem of confining emitted light laterally in the region of the laser cavity. Because the devices are grown as planar regions extending laterally beyond the intended active area, the regions laterally peripheral to the active areas have indices of refraction identical or very nearly equal to the indices of refraction in the active area. This matching permits lateral coupling away from the active area. Accordingly, there is a need for a VCSEL device providing enhanced optical confinement.

SUMMARY OF THE INVENTION

The present applicants have discovered that one can make a surface emitting laser with enhanced optical confinement and improved heat sinking characteristics by etching away portions of the growth layers peripheral to the intended laser cavity and regrowing peripheral regions of material having a lower index of refraction than the active region. Using low damage etching and either in situ regrowth or hydrogen plasma cleaning followed by regrowth, a surface emitting laser having enhanced optical isolation and heat sinking characteristics can be made.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a schematic cross section of a conventional planar surface emitting laser useful in explaining the problem to which the present invention is directed;

FIG. 2 is a schematic cross section of a first embodiment of a surface emitting laser in accordance with the invention;

FIG. 3 is a schematic cross section of an alternative embodiment of a laser.

Figure 4:
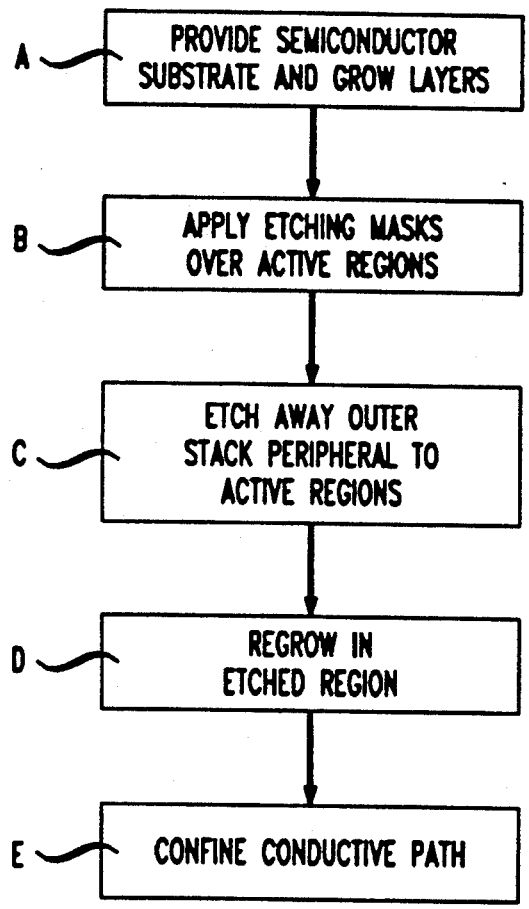
FIG. 4 is a block diagram illustrating the steps of the preferred process for making the structure of FIGS. 2 and 3.

It is to be understood that these drawings are for purposes of illustrating the concepts of the invention and are not to scale.

DETAILED DESCRIPTION

Referring to the drawing, FIG. 1 is a schematic cross section of a conventional surface emitting laser 9 comprising, in essence, an active region 10 disposed between a pair of distributed Bragg reflector stacks 11 and 12. The structure is typically fabricated on a semiconductor substrate 13 such as n-type gallium arsenide. The inner reflector stack 11 comprises periodic layers such as layers of aluminum gallium arsenide and aluminum arsenide. Advantageously, the layers of inner stack 11 are doped with the same type impurity as the substrate. The active region 10 typically comprises alternating barrier layers and quantum well layers such as alternating layers of aluminum gallium arsenide and gallium arsenide. Alternatively, the active region can be a GaAs heterostructure. The outer reflector stack 12 is made up of periodic layers such as p-type aluminum gallium arsenide and aluminum arsenide. Regions 14 of the well layers peripheral to active region 10 are rendered highly resistive by proton implantation, and ohmic contacts 15 and 16 are made to substrate 13 and to the outer stack 12, respectively, in order to provide current to the active region.

In operation of the conventional device, voltage applied between contacts 15 and 16 produces a current between them which is channeled by implantation regions 14 through active region 10. Light generated in the active region is reflected between stacks 11 and 12 with a portion typically emitted through outer stack 12. Since the direction of light emission is perpendicular to the growth planes, the structure is referred to as a vertical cavity surface emitting laser.

One difficulty with this conventional structure is that the regions 14 peripheral to the active region 10 are made of the same kinds of material as the active region with the result that the peripheral regions have indices of refraction which are identically matched with the active region. The consequence is that a substantial portion of the laser light emitted within the active region 10 is coupled in the lateral dimension away from the active region. This problem is not readily solved by simply etching away the peripheral regions because it would be difficult to electrically contact the active region, and the exposed walls would present serious problems of contamination. In addition the exposed walls would greatly increase the optical loss due to non-radiative recombination.

FIG. 2 is a cross section of a surface emitting laser 19 formed on a substrate 23 in accordance with the invention. This structure comprises an active region 20A disposed between a pair of reflective stacks 21 and 22. However, in the FIG. 2 structure, the portions peripheral to active region 20A have been etched away, leaving walls 20B. Layers 24A and 24B of material having an index of refraction lower than that of active region 20A have been regrown. Advantageously, portions of the outer stack 22 peripheral to the active region are etched away at the same time, and regrown layer 24A extends to the top of stack 22 to provide a planar outer surface. Preferably an $SiO_2$ window 50 is disposed on the outer surface of stack 22 overlying active region 20A.

The interface between 20A and layer 24B at wall 20B behaves as a reflecting surface. Thus the interface at 20B enhances optical confinement of the active region.

Current confinement to the active region 20A can be achieved by making layer 24B non-conductive while layer 24A is conductive. Thus current through layer 24A will be channeled through the active region. Preferably, layers 24A and 24B are grown as a single layer and the inner portion of the layer is made non-conductive as by deep ion implantation to become layer 24B. Layer 24A is preferably grown as a doped layer of sufficient conductivity to permit ohmic contact and to provide a current path to active region 20A. Ohmic metal contacts 25 and 26 are disposed on region 24A and substrate 23, respectively, for providing the thus channeled current.

FIG. 3 is an alternative embodiment of a surface emitting laser similar to the device of FIG. 2 except that the regrown layer comprises outer and inner layers 24C and 24E of one type of conductivity (typically p) sandwiching an intermediate layer 24D of the other type of conductivity (typically n). The regrown layer thus contains a pair of back-to-back pn junctions 30 and 31 which preclude current from 24C flowing to 24E. Here the index of layer 24E is chosen to confine light within the active region, but current is confined to the active region by the inner junction 31.

In typical structures active region 20A comprises a p-doped outer confinement layer 40, an intermediate quantum well region 41 and an inner, intrinsic confinement layer 42. Advantageously the inner surface 31 of n layer 24D (forming junction 31) does not fall below the p-doped confinement layer 40. Also advantageously, portions of the grown layer remote from the laser can be rendered non-conductive by ion implantation or be etched away to electrically isolate individual lasers.

Figure 5:
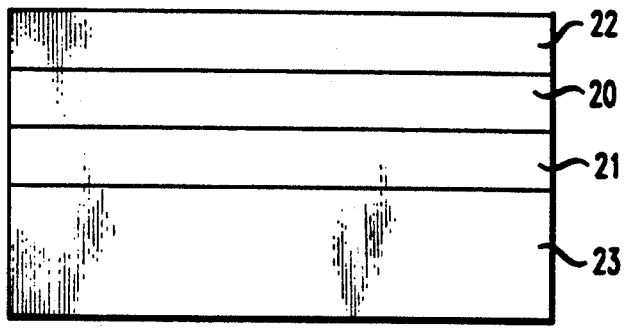
FIGS. 5-7 illustrate the workpiece at various steps in the fabrication process.
Figure 6:
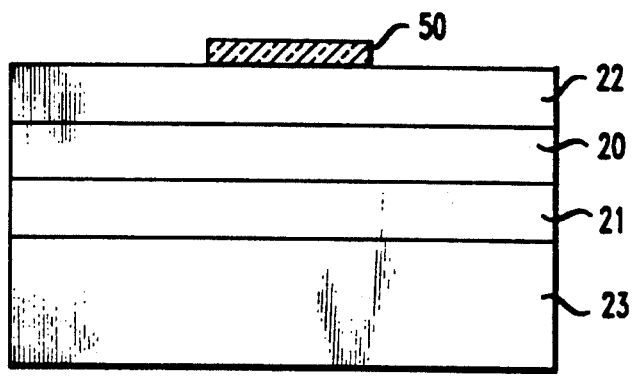
Figure 7:
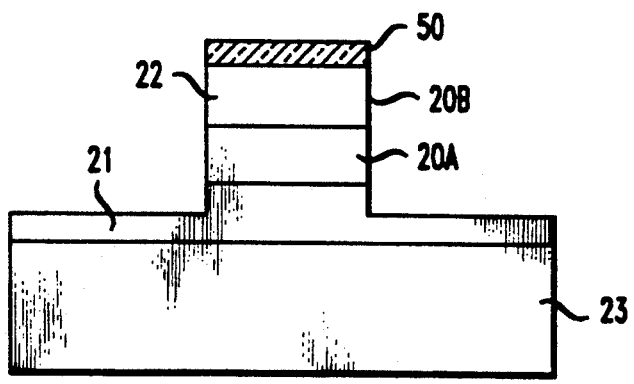

The preferred method for making the structure of FIGS. 2 and 3 can be understood by reference to FIG. 4, which is a block diagram showing the steps of the preferred process. FIGS. 5-7 show a workpiece at various stages of the process.

As shown in FIG. 4A, the initial step involves providing a semiconductor substrate 23 and epitaxially growing on the substrate the series of layers forming the inner reflector stack 21, the active region layers 20 and the outer reflector stack 22. These layers can be formed using molecular beam epitaxy (MBE) in accordance with techniques well known in the art. Preferably the substrate is n-doped gallium arsenide. The bottom reflector stack 21 can be grown as a staircase distributed Bragg reflector comprising thirty periods of layers, each period consisting of 515 Å of $Al_{0.16}Ga_{0.84}As$, 99 Å of $Al_{0.58}Ga_{0.42}As$, 604 Å of AlAs and 99 Å of $Al_{0.58}Ga_{0.42}As$. The AlGaAs layers are doped with n-type impurity such as silicon, to a concentration of $3 \times 10^{18}$ $cm^{-3}$.

The active region 20 can be grown as an inner confinement layer 42 of intrinsic $Al_{0.16}Ga_{0.84}As$ grown on stack 21. The thickness of layer 42 is preferably chosen so that the central antinode of standing waves will overlap the quantum wells. In this example, the thickness is about 890 Å. The quantum well region 41 grown on confinement layer can comprise five quantum wells (not shown) consisting of 70 Å well layers of GaAs and 70 Å barrier layers of $Al_{0.16}Ga_{0.84}As$. Upper confinement layer 40 can be a second 890 Å $Al_{0.16}Ga_{0.84}As$ layer doped with p-type impurities such as Be to a concentration of $1 \times 10^{17}$ $cm^{-3}$.

The outer reflector stack 22 can be grown on layer 40. The outer stack 22 is similar to the inner stack except stack 22 is p-doped with Be to a concentration of $3 \times 10^{18}$ $cm^{-3}$ and comprises fewer periods, e.g. 20, so that light will be emitted.

The next step shown in FIG. 4B is to provide the outer surface of the workpiece with an etching mask 50 selectively overlying the area where active region 20A of the laser is to be formed. The resulting structure is shown in FIG. 6. The mask 50 can be a 10-20 micrometer diameter dot of 3000-6000 Å thick silicon dioxide formed by plasma-enhanced chemical vapor deposition and patterned in accordance with photolithographic techniques well known in the art. A silicon dioxide mask not only provides for definition of the laser active area during fabrication but also provides transparent protection over the laser facet after fabrication. Preferably, its thickness is chosen to act as a half wave plate for the laser wavelength.

The third step illustrated in FIG. 4C is etching away the regions of outer stack 22 and the active layers 20 that are peripheral to the active region 20A. Advantageously the upper peripheral regions of inner stack 21 are etched away in the same step. The etching can be done in any of a variety of ways including reactive ion etching, ion beam assisted etching, or chemically assisted ion beam etching. Preferably, the etching is effected by dry etching under conditions producing a non-selective, low damage anisotropic etch such as by electron cyclotron resonance (ECR) etching. During the etching step, the depth should be closely monitored. Accurate depth monitoring during etching can be accomplished by laser reflectometry. The etched structure is shown in FIG. 7.

The next step shown in FIG. 4D is to epitaxially regrow a layer of material 24, such as AlGaAs, to fill in the etched away layers. The material composition is chosen to have an index of refraction lower than the average index of the active region 20A in order to produce a reflecting interface. Advantageously, the difference in indices is on the order of 0.1 or more. Preferably, the regrown material is $Al_{0.40}Ga_{0.60}As$. Regrowth can be done using any of a variety of processes including MBE, chemical beam epitaxy, MOCVD, or gas source MBE. This regrowth can be accomplished in one of two ways: either in situ without breaking vacuum after etching or in conjunction with hydrogen plasma cleaning prior to regrowth if atmospheric exposure after etching has occurred.

For in situ regrowth, after etching the workpieces are transferred in vacuum from the ECR chamber to a heating chamber and are heated to approximately 250°-500° C. in a $2 \times 10^{-11}$ Torr vacuum for 20 minutes to desorb reaction products and physisorbed gas on the surfaces. The workpieces are then transferred in vacuum to a growth chamber such as an MBE chamber.

In the growth chamber the workpieces are heated to approximately 640° C. in an As overpressure for 10 minutes. The workpiece temperature is then adjusted to 580°-700°, and the growth of AlGaAs is initiated. For the FIG. 2 structure the regrown layer 24 can be p-doped aluminum gallium arsenide. For the FIG. 3 structure, the dopants are switched during regrowth to produce the p-n-p structure of layers 24c, 24d and 24e in accordance with techniques well known in the art.

The alternative regrowth process does not require maintenance of high vacuum, but rather uses hydrogen plasma cleaning prior to regrowth. Assuming atmospheric exposure after the etching step, the workpieces are introduced into the ECR chamber for hydrogen plasma processing, and oriented at approximately 80° from normal incidence to the ECR source. The substrate is heated to approximately 300° C., hydrogen gas is introduced at a flow rate of 10-20 SCCM to give a working pressure of $1-2 \times 10^{-4}$ Torr, and microwave power is varied between 100 and 200 watts for 30-60 minutes. After plasma processing, the workpieces are transferred in vacuum to another chamber where they are heated to about 250°-500° C. for 20 minutes to remove any residual physisorbed gas or reaction products and to anneal the surface. The samples are then moved in vacuum to the MBE chamber for regrowth as described above.

The fifth step illustrated in FIG. 4E is for the FIG. 2 structure only. This step is confining the conductive path to the active region 20A by rendering layer 24B non-conductive. Specifically, this can be accomplished by deep ion implantation as, for example, by implantation of H+ ions at about 280 KeV. The resulting structure is a device of the type shown in FIG. 2. The FIG. 3 embodiment achieves similar confinement by the p-n junctions formed in the regrowth step.

As final steps (not shown), ohmic contacts 25 and 26 are applied to region 24 and to the back side of the substrate using conventional deposition and photolithographic techniques. The individual lasers can then be isolated by deep trenches.

It is to be understood that the above-described embodiments are illustrative of only some of the many possible specific embodiments which can represent application of the principles of the invention. For example, while the invention has been described in the context of a preferred gallium arsenide system, other compound semiconductor material systems such as indium phosphide and gallium antimonide can also be used. Thus numerous and varied other arrangements can be made by those skilled in the art without departing from the spirit and scope of the invention.

We claim:

1. In a semiconductor surface emitting laser of the type comprising an active region disposed between a pair of reflector stacks, the improvement wherein the region peripheral to said active region comprises material having an index of refraction lower than that of said active region for forming an optically confining interface with said active region.

2. The improved surface emitting laser of claim 1, wherein said active region comprises gallium arsenide quantum wells disposed between aluminum gallium arsenide barrier layers and the material peripheral to said active region comprises aluminum gallium arsenide having an index of refraction lower than the average index of refraction of the active region.

3. The improved surface emitting laser of claim 1, wherein the difference in indices of refraction is 0.1 or greater.

4. The improved surface emitting laser of claim 2, wherein said reflector stacks each comprise layers of aluminum arsenide and aluminum gallium arsenide.

5. The improved surface emitting laser of claim 1, wherein regions of the regrown layer are rendered non-conductive by ion implantation for confining current flow to the active region.

6. The improved surface emitting laser of claim 1, wherein the regrown layer comprises a p-n junction for confining current flow to the active region.

* * * * *